United States Patent
Shimizu et al.

[11] Patent Number: 5,568,092
[45] Date of Patent: Oct. 22, 1996

[54] ATTENUATED FEEDBACK TYPE DIFFERENTIAL AMPLIFIER

[75] Inventors: Toshifumi Shimizu; Hiroshi Narikawa; Yoshiyuki Tamura, all of Kanagawa, Japan

[73] Assignee: NEC Corporation, Japan

[21] Appl. No.: 449,528

[22] Filed: May 24, 1995

[30] Foreign Application Priority Data

May 24, 1994 [JP] Japan .................................. 6-109855

[51] Int. Cl.$^6$ ....................................................... H03F 3/45
[52] U.S. Cl. .............................. 330/260; 330/311; 360/67
[58] Field of Search ..................................... 330/260, 311; 360/67, 68

[56] References Cited

U.S. PATENT DOCUMENTS 3,399,357  8/1968  Weilerstein .............................. 330/260

FOREIGN PATENT DOCUMENTS

2-223209  9/1990  Japan .

Primary Examiner—James B. Mullins
Attorney, Agent, or Firm—Ostrolenk, Faber, Gerb & Soffen, LLP

[57] ABSTRACT

A differential amplifier includes an input stage for receiving input signals, an output stage for generating output signals, and an attenuating circuit for attenuating the output signals and feeding attenuation signals back to the input stage. The input stage includes a current switch formed by two transistors connected commonly to a current source and each connected to two load amplifiers. The load amplifiers are controlled by the attenuation signal, to substantially reduce the amplification of the two transistors.

11 Claims, 8 Drawing Sheets

ATTENUATED FEEDBACK TYPE DIFFERENTIAL AMPLIFIER

BACKGROUND OF THE INVENTION

1. Field of the Invention

The present invention relates to a differential amplifier used for amplifying a read signal in a magnetic memory device, i.e., a hard disk, a semiconductor memory device, and the like.

1. Description of the Related Art

A differential amplifier for amplifying a read signal in a hard disk or a semiconductor memory device has to satisfy the following two requirements:

1) a differential input capacity is as small as possible; and 2) a noise level in an output signal is as small as possible.

For example, in a hard disk having an increased memory density, the frequency of a read signal is higher. Therefore, when the differential input capacity of the differential amplifier as a read amplifier is large, it is difficult to sense the read signal. Also, when the amplitude of the read signal is small, i.e., the S/N ratio thereof is small, a high noise level in the differential amplifier may invite a read error.

A first prior art differential amplifier includes an input stage for receiving and amplifying input signals, and an output stage formed by emitter followers for receiving amplified signals from the input stage to generate output signals. This will be explained later in detail. In the first prior art differential amplifier, however, the differential input capacity is still large, although the noise level of the output signals is small.

In a second prior art differential amplifier, the output signals of the output stage are fed back to the input stage (see: JP-A-HEI2-223209). This will be explained later in detail. In the second prior art differential amplifier, however, the noise level of the output signals is still large, although the differential input capacity is small.

SUMMARY OF THE INVENTION

It is an object of the present invention to provide a differential amplifier having a differential small input capacity and a small noise level in output signals.

According to the present invention, a differential amplifier includes an input stage for receiving input signals, an output stage for generating output signals, and an attenuating circuit for attenuating the output signals and feeding attenuation signals back to the input stage. The input stage includes a current switch formed by two transistors connected commonly to a current source and each connected to two load amplifiers. The load amplifiers are controlled by the attenuation signals, to substantially reduce the differential input capacity. In this case, even when the amplification of the two transistors is substantially reduced, the amplification of the load amplifiers is adjustable to maintain the amplification of the entire differential amplifier at a high value. Also, since the amplification of the output stage formed by the emitter followers is small, the noise level in the output signals is reduced.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENT

Before the description of the prefered embodiment, prior art differential amplifiers will be explained with reference to FIGS. 1 and 2.

In FIG..1, which illustrates the first prior art differential amplifier, reference numeral 1 designates an input stage for receiving and amplifying input signals $V_{in}$ and $\overline{V}_{in}$, and 2 designates an output stage for generating output signals $V_{out}$ and $\overline{V}_{out}$. Also, $V_{CC}$ designates a high power supply terminal and $V_{EE}$ designates a low power supply terminal.

The input stage 1 includes a differential stage, i.e., a current switch formed by a current source $I_1$ connected to the power supply terminal $V_{EE}$ and two NPN type bipolar transistors $Q_1$ and $Q_2$ having emitters commonly connected to the current source $I_1$. The bases of the transistors $Q_1$ and $Q_2$ receive the input signals $V_{in}$ and $\overline{V}_{in}$, respectively. The collectors of the transistors $Q_1$ and $Q_2$ are connected via NPN type bipolar transistors $Q_3$ and $Q_4$ and resistors $R_1$ and $R_2$ to the power supply terminal $V_{CC}$. In this case, the transistors $Q_3$ and $Q_4$ are of a common-base type where a definite voltage $V_{REF}$ is applied to the bases thereof, and therefore, the transistors $Q_3$ and $Q_4$ serve as operating resistors. Thus, an amplification $A_0$ of the transistors $Q_1$ and $Q_2$ at the collectors thereof is almost 1. In this case, a differential input capacity $C_{in^1}$ can be represented by $$C_{in^1} = 1/2 \cdot (1+A_0) \cdot C_{CB} + \frac{1}{2} \cdot C_{EB} \qquad (1)$$

where $C_{CB}$ is a capacity between the collector and base of each of the transistors $Q_1$ and $Q_2$; and $C_{EB}$ is a capacity between the emitter and base of each of the transistors $Q_1$ and $Q_2$. Also, as stated above, since $A_0=1$, then the formula (1) is replaced by $$C_{in^1} = C_{CB} + \frac{1}{2} \cdot C_{EB} \qquad (2)$$

Further, if $C_{CB} = C_{EB} = 10$ pF, then the formula (2) is replaced by $$C_{in^1} = 10 + 5 = 15 \text{ pF} \qquad (3)$$

On the other hand, the output stage 2 includes emitter followers $Q_5$ and $Q_6$ connected to current sources $I_2$ and $I_3$, respectively. In this case, a noise level $V_{NO^1}$ in the output signals $V_{out}$ and $\overline{V}_{out}$ can be represented by $$V_{NO^1} = \sqrt{(V_{N^1} \cdot A_1)^2 + V_{N^2}^2 \cdot A_2(V_{rms})} \quad (4)$$

where $V_{N^1}$ is a noise level of the input stage 1;
$V_{N^2}$ is a noise level of the output stage 2;
$A_1$ is a differential amplification of the transistors $Q_3$ and $Q_4$ at their collectors; and
$A_2$ is an amplification of each of the emitter followers $Q_5$ and $Q_6$.

Figure 1:
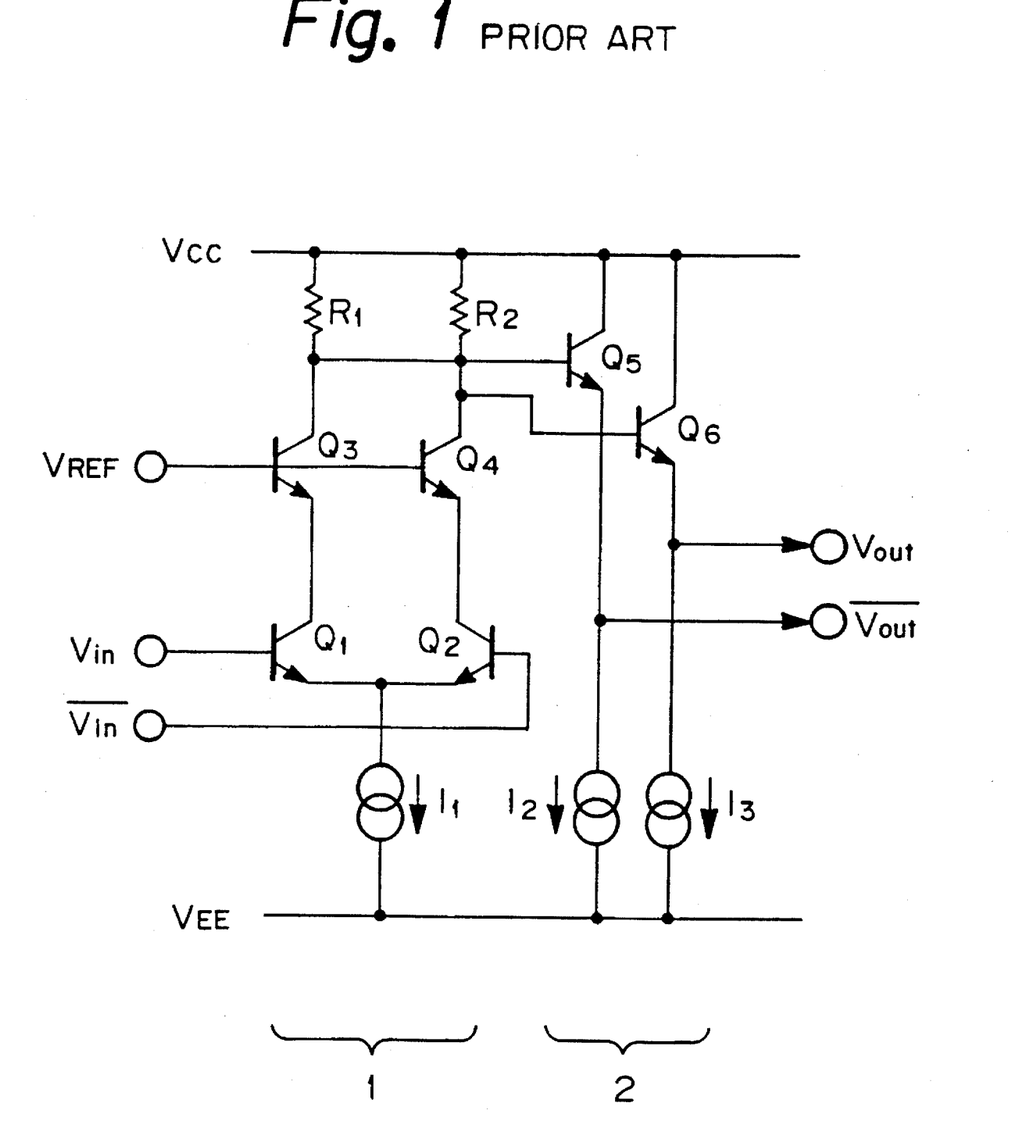
FIG. 1 is a circuit diagram illustrating a first prior art differential amplifier.

A total amplification $A_{TOT^1}$ of the differential amplifier of FIG. 1 is represented by $$A_{TOT^1} = A_1 \cdot A_2 \quad (5)$$

Therefore, the formula (4) is replaced by $$V_{NO^1} = \sqrt{(V_{N^1} \cdot A_{TOT^1})^2 + (V_{N^2} \cdot A_2)^2} \quad (6)$$

Since the amplification $A_2$ of the emitter followers $Q_5$ and $Q_6$ is 1, $A_{TOT^1} = A_1$. Therefore, if $A_1 = 30$ and $V_{N^1} = V_{N^2} = 1.0$ $nV_{ems}$, then $$\begin{aligned} V_{NO^1} &= \sqrt{(1.0 \times 30)^2 + (1.0 \times 1)^2} \\ &= 30.02 \, nV_{rms} \end{aligned} \quad (7)$$

Figure 2:
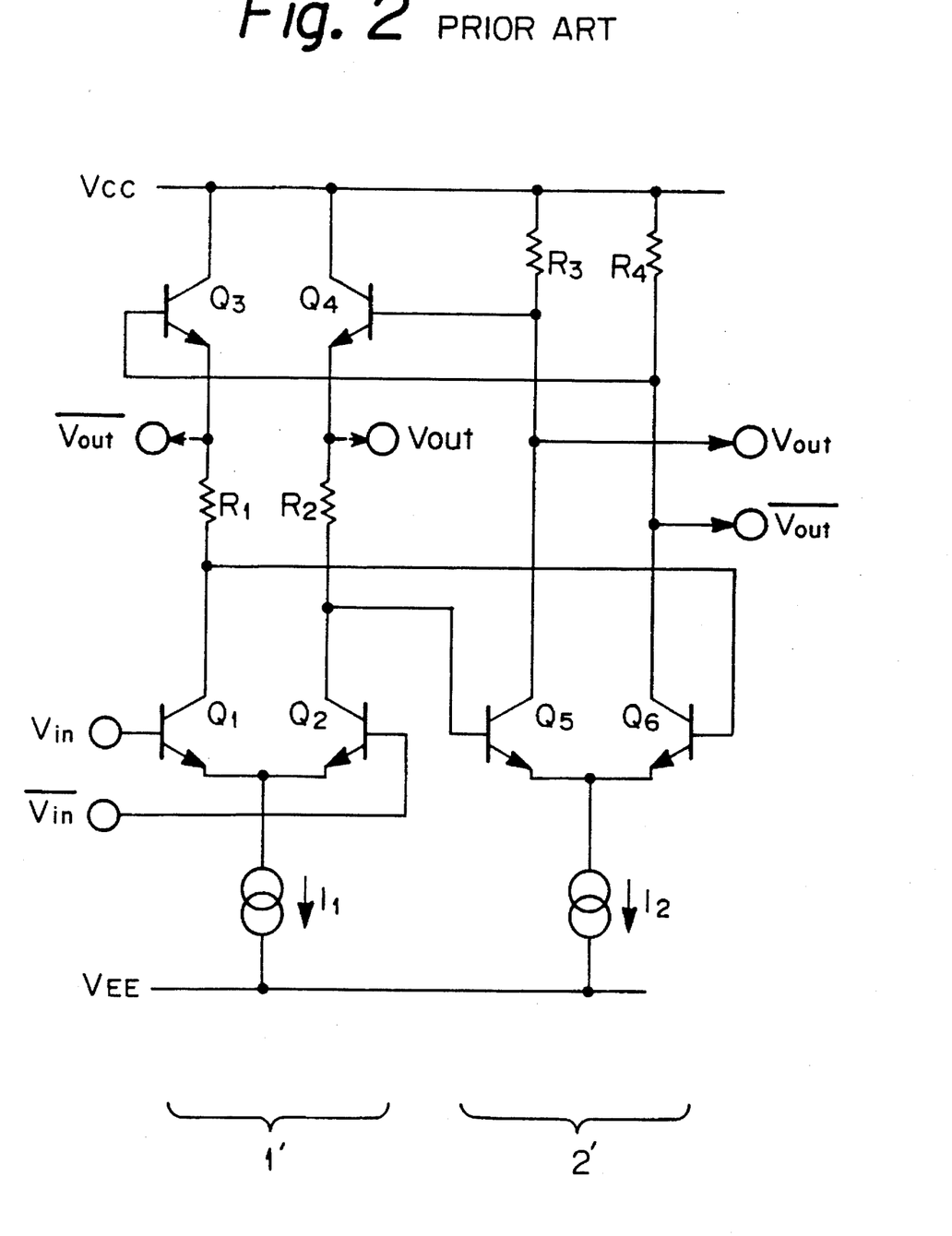
FIG. 2 is a circuit diagram illustrating a second prior art differential amplifier.

In FIG. 2, which illustrates a second prior art differential amplifier (see: JP-A-HEI2-223209), reference numeral 1' designates an input stage for receiving and amplifying input signals $V_{in}$ and $\overline{V}_{in}$, and 2' designates an output stage for generating output signals $V_{out}$ and $\overline{V}_{out}$. Each of the input stage 1' and the output stage 2' serves as one differential amplifier. In this case, the output signals $V_{out}$ and $\overline{V}_{out}$ of the output stage 2' are fed back in opposite phase to the input stage 1'.

The input stage 1' includes a differential stage i.e., a current switch formed by a current source $I_1$ connected to the power supply terminal $V_{EE}$ and two NPN type bipolar transistors $Q_1$ and $Q_2$ having emitters commonly connected to the current source $I_1$. The bases of the transistors $Q_1$ and $Q_2$ receive the input signals $V_{in}$ and $\overline{V}_{in}$, respectively. The collectors of the transistors $Q_1$ and $Q_2$ are connected via resistors $R_1$ and $R_2$ and NPN type bipolar transistors $Q_3$ and $Q_4$ to the power supply terminal $V_{CC}$.

On the other hand, the input stage 2' includes a differential stage, i.e., a current switch formed by a current source $I_2$ connected to the power supply terminal $V_{EE}$ and two NPN type bipolar transistors $Q_5$ and $Q_6$ having emitters commonly connected to the current source $I_2$. The bases of the transistors $Q_1$ and $Q_2$ receive the voltages at the collectors of the transistors $Q_2$ and $Q_1$, respectively. The collectors of the transistors $Q_5$ and $Q_6$ are connected via resistors $R_3$ and $R_4$, respectively, to the power supply terminal $V_{CC}$.

The output signals $V_{out}$ and $\overline{V}_{out}$ are fed back to the gates of the transistors $Q_4$ and $Q_3$, respectively.

In the differential amplifier of FIG. 2, a differential amplification $A_{3_F}$ of the transistors $Q_1$ and $Q_2$ at the collectors thereof where a feed back is performed is represented by $$A_{3_F} = A_3/(A_4 - 1) \quad (8)$$

where $A_3$ is a differential amplification of the transistors $Q_1$ and $Q_2$ at the collectors thereof ($A_3 = 1$) where no feed back is performed; and $A_4$ is an amplification of the transistors $Q_5$ and $Q_6$.

In this case, the amplifications $A_3$ and $A_4$ are so determined as to satisfy the following condition:

$$A_3 < 1 \quad (9)$$

For example, $A_3 = 1$ and $A_4 = 3$, then $$A_{3_F} = 0.5 \quad (10)$$

Also, a differential input capacity $C_{in}^2$ can be represented by $$C_{in}^2 = 1/2 \cdot (1 + A_{3_F}) \cdot C_{CB} + \frac{1}{2} \cdot C_{EB} \quad (11)$$

where $C_{CB}$ is a capacity between the collector and base of each of the transistors $Q_1$ and $Q_2$; and
$C_{EB}$ is a capacity between the emitter and base of each of the transistors $Q_1$ and $Q_2$. Also, if $A_{3_F} = 0.5$ and $C_{CB} = C_{EB} = 10$ pF, then, the formula (11) is replaced by $$C_{in}^2 = 7.5 + 5 = 12.5 \text{ pF} \quad (12)$$

On the other hand, a noise level $V_{NO^2}$ in the output signals $V_{\overline{out}}$ and $V_{\overline{out}}$ can be represented by $$V_{NO^2} = \sqrt{(V_{N^3} \cdot A_{3_F})^2 + V_{N^4}^2 \cdot A_4(V_{rms})} \quad (13)$$

where $V_{N^3}$ is a noise level of the input stage 1';
$V_{N^4}$ is a noise level of the output stage 2'; and
$A_4$ is an amplification of each of the emitter followers $Q_5$ and $Q_6$.

A total amplification $A_{TOT^2}$ of the differential amplifier of FIG. 2 is represented by $$A_{TOT^2} = A_{3_F} \cdot A_4 \quad (14)$$

Therefore, the formula (13) is replaced by $$V_{NO^1} = \sqrt{(V_{N^3} \cdot A_{TOT^2})^2 + (V_{N^4} \cdot A_4)^2} \quad (15)$$

$A_{TOT^2} = A_{TOT^1} = 30$, then $$\begin{aligned} A_4 &= A_{TOT^2}/A_{3_F} \\ &= 60 \end{aligned} \quad (16)$$

Also, if $V_{N^1} = V_{n^2} = 1.0 \, nV_{rms}$, then $A_{TOT^2} = A_{TOT^1} = 30$, then $$\begin{aligned} V_{NO^2} &= \sqrt{(1.0 \times 30)^2 + (1.0 \times 60)^2} \\ &= 67.08 \, nV_{rms} \end{aligned} \quad (17)$$

From the formulae (3) and (12), $$C_{in}^2/C_{in^1} = 0.83 \quad (18)$$

Therefore, the diffential input capacity of the differential amplifier of FIG. 2 is smaller than that of the differential amplifier of FIG. 1. That is, in the differential amplifier of FIG. 1, the differential input capacity $C_{in^1}$ depends upon the amplification $A_0$ of the transistors $Q_1$ and $Q_2$ at their collectors (see formula (1)). Contrary to this, in the differential amplifier of FIG. 2, the differential input capacity $C_{in}^2$ depends upon the differential amplification $A_{3_f}$ of the transistors $Q_1$ and $Q_2$ at their collectors where a feedback is performed (see formula (11)). Since $A_0=1$ and $A_{3_f}<1$ ($A_{3_f}=0.5$), the differential input capacity is smaller in the differential amplifier of FIG. 2 than in the differential amplifier of FIG. 1.

Conversely, from the formulae (7) and (17), $$V_{NO}^2/V_{NO}^1 = 2.23 \quad (19)$$

Therefore, the noise level of the output signals of the differential amplifier of FIG. 2 is larger than that of the differential amplifier of FIG. 1. That is, in the differential amplifier of FIG. 1, the noise level $V_{NO}^1$ depends upon the amplification of $A_2$ of the output stage 2 (see formula (6)). Contrary to this, in the differential amplifier of FIG. 2, the noise level $V_{NO}^2$ depends upon the amplification $A_4$ (see formula (15)). In order to maintain the condition $A_{TOT}^1 = A_{TOT}^2$, the amplification $A_4$ has to be larger, for example, $A_4=60$. Therefore, if $A_2=1$ and $A_4>1$ ($A_4=60$), the noise level is larger in the differential amplifier of FIG. 2 than in the differential amplifier of FIG. 1.

Thus, in the prior art, a small differential input capacity and a small output noise are not incompatible with each other.

Figure 3:
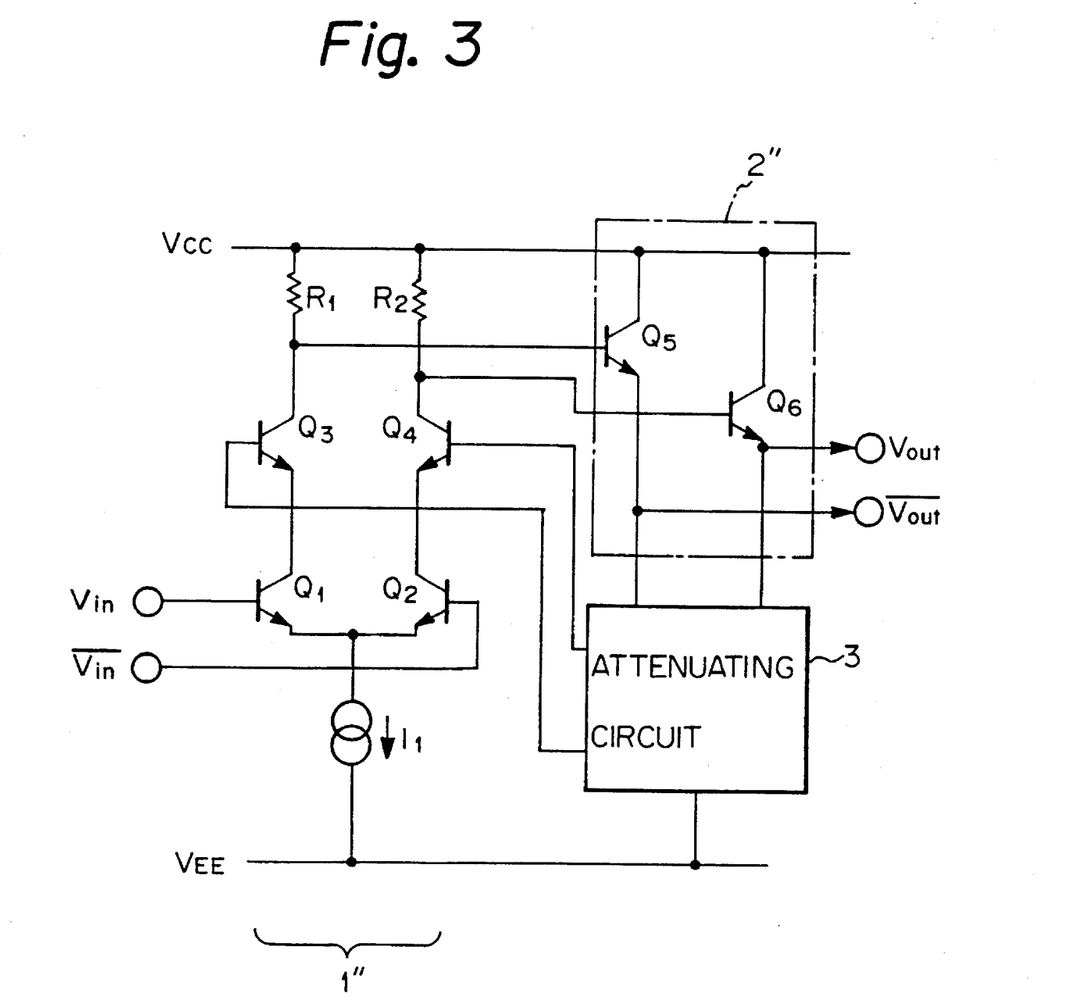
FIG. 3 is a circuit diagram illustrating an embodiment of the differential amplifier according to the present invention.

In FIG. 3, which illustrates an embodiment of the present invention, reference numeral 1" designates an input stage for receiving and amplifying input signals $V_{in}$ and $\overline{V}_{in}$, 2" designates an output stage for generating output signals $V_{out}$ and $\overline{V}_{out}$, and 3 designates an attenuating circuit (or feedback circuit) for attenuating the output signals $V_{out}$ and $\overline{V}_{out}$ and transmitting them in opposite phase to the input stage 1".

The input stage 1" includes a differential stage i.e., a current switch formed by a current source $I_1$ connected to the power supply terminal $V_{EE}$ and two NPN type bipolar transistors $Q_1$ and $Q_2$ having emitters commonly connected to the current source $I_1$. The bases of the transistors $Q_1$ and $Q_2$ receive the input signals $V_{in}$ and $\overline{V}_{in}$, respectively. The collectors of the transistors $Q_1$ and $Q_2$ are connected via NPN type bipolar transistors $Q_3$ and $Q_4$ and resistors $R_1$ and $R_2$ to the power supply terminal $V_{CC}$. In this case, the transistors $Q_3$ and $Q_4$ are controlled by the attenuating circuit 3. The transistor $Q_3$ and the resistor $R_1$ form a load amplifier whose amplification $A_7$ is determined by the value of the resistor $R_1$. Similarly, the transistor $Q_4$ and the resistor $R_2$ form a load amplifier whose amplification $A_7$ is determined by the value of the resistor $R_2$.

The output stage 2" includes emitter followers $Q_5$ and $Q_6$ for generating the output signals $V_{out}$ and $\overline{V}_{out}$. The emitter followers $Q_5$ and $Q_6$ are controlled by the voltages at the collectors of the transistor $Q_3$ and $Q_4$ of the input stage 1".

The output signals $V_{out}$ and $\overline{V}_{out}$ of the output stage 2" are fed back via the attenuating circuit 3 to the bases of the transistors $Q_4$ and $Q_3$.

In the differential amplifier of FIG. 3, a differential amplification $A_{5_F}$ of the transistors $Q_1$ and $Q_2$ at the collectors thereof where a feed back is performed is represented by $$A_{5_F} = A_5/(A_6-1) \quad (20)$$

where $A_5$ is a differential amplification of the transistors $Q_1$ and $Q_2$ at the collectors thereof ($A_5=1$) where no feed back is performed; and $A_6$ is a differential feedback amplification of the attenuation circuit 3.

Note that the differential feedback amplification $A_6$ is represented by $$A_6 = A_{TOT}^3 \cdot 19 \cdot 1/n \quad (21)$$

where $A_{TOT}^3$ is a total differential amplification of the differential amplifier of FIG. 3;

1/n is an attenuation factor of the attenuating circuit 3;

$A_7$ is a differential amplification of the transistors $Q_3$ and $Q_4$; and $A_8$ is a differential amplification of the transistors $Q_5$ and $Q_6$. Also, the differential amplification $A_5$ is determined by a ratio of an operating resistor $R_{eQ}^1=(kT/q)/I_{EQ}^1$ of the transistor $Q_1$ to an operating resistor $r_{eQ}^2=(kT/q)/I_{EQ}^2$ where k is a Boltzmann's coefficient, T is an absolute temperature, and q is a charge of an electron; in this case, $I_{EQ}^1=I_{EQ}^2$, and as a result, $A_5=1$.

Therefore, the formula (20) is replaced by $$A_{5_F} = 1/(A_6-1) \quad (22)$$

Also, a differential input capacity $C_{in}^3$ can be represented by $$C_{in}^3 = 1/2 \cdot (1+A_{5_F}) \cdot C_{CB} + \frac{1}{2} \cdot C_{EB} \quad (23)$$

where $C_{CB}$ is a capacity between the collector and base of each of the transistors $Q_1$ and $Q_2$.

$C_{EB}$ is a capacity between the emitter and base of each of the transistors $Q_1$ and $Q_2$.

Also, if $A_{5_F}=0.5$ and $C_{CB}=C_{EB}=10$ pF, then, the formula (23) is replaced by $$C_{in}^3 = 7.5 + 5 = 12.5 \text{ pF} \quad (24)$$

On the other hand, a noise level $L_{NO}^1$ in the output signals $\overline{V}_{out}$ and $\overline{V}_{out}$ can be represented by $$V_{NO}^3 = \sqrt{(V_N^5 \cdot A_{5_F} \cdot A_7)^2 + V_{N}^{6\,2} \cdot A_8(V_{rms})} \quad (25)$$

where $V_N^5$ is a noise level of the input stage 1"; and
$V_N^6$ is a noise level of the output stage 2".

The total amplification $A_{TOT}^3$ of the differential amplifier of FIG. 3 is represented by $$A_{TOT}^3 = A_{5_F} \cdot A_7 \cdot A_8 \quad (26)$$

Therefore, since $A_8=1$, the formula (25) is replaced by $$V_{NO}^3 = \sqrt{(V_N^5 \cdot A_{TOT}^3)^2 + V_{N}^{6\,2}} \quad (27)$$

If $A_{TOT}^3=A_{TOT}^2=A_{TOT}^1=30$ and $V_N^5=V_N^6=1.0$ nV$_{rms}$, then $$V_{NO}^3 = \sqrt{(1.0 \times 30)^2 + 1.0^2} \quad (28)$$
$$= 30.02 \, nV_{rms}$$

Thus, in the embodiment as illustrated in FIG. 3, the differential input capacity is as small as that of the differential amplifier of FIG. 2, and also, the noise level is as small as that of the differeantial amplifier of FIG. 1.

Examples of the attenuating circuit 3 of FIG. 3 will be explained next with reference to FIGS. 4, 5, 6, 7 and 8.

Figure 4:
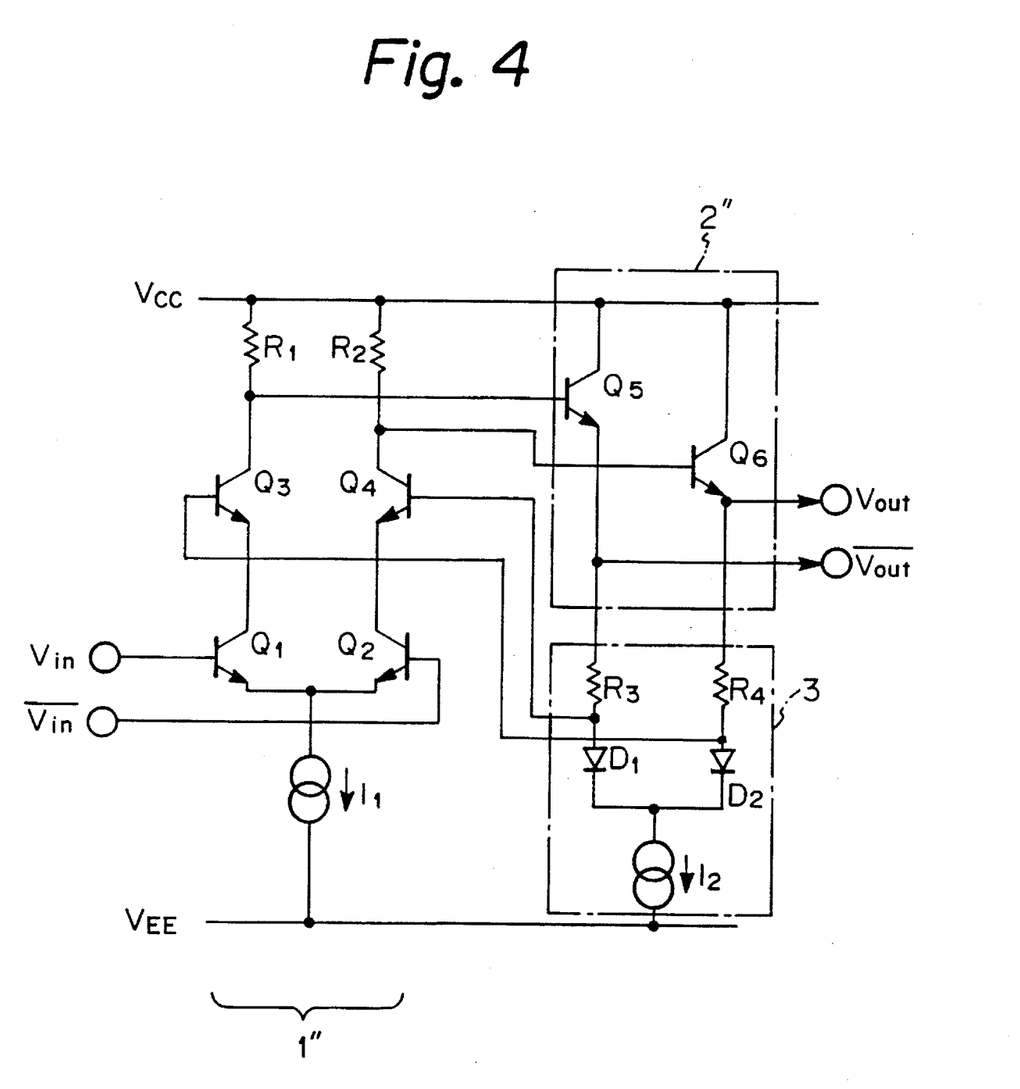
FIG. 4 is a detailed circuit diagram of the differential amplifier of FIG. 3 having a first example of the attenuating circuit.

A first example of the attenuating circuit 3 of FIG. 3 is illustrated in FIG. 4. That is, the attenuating circuit 3 includes a resistor $R_3$ connected to the emitter follower $Q_5$ of the output stage 2" and a diode $D_1$ connected to the resistor $R_3$, also includes a resistor $R_4$ connected to the emitter follower $Q_6$ of the output stage 2" and a diode $D_2$ connected to the resistor $R_4$. Further the attenuating circuit 3 includes a current source $I_2$ connected commonly to the diodes $D_1$ and $D_2$. A voltage at a node between the resistor $R_3$ and the anode of the diode $D_1$ is fed back to the base of the transistor $Q_4$ of the input stage 1". Similarly, a voltage at a node between the resistor $R_4$ and the anode of the diode $D_2$ is fed back to the base of the transistor $Q_3$ of the input stage 1".

A feedback amplification $A_{61}$ of the attenuating circuit 3 to the base of the transistor $Q_4$ is represented by $$A_{61} = r_{D^1}/(R_3 + r_{D^1}) \cdot A_{TOT}{}^3/2 \qquad (29)$$

where $R_{D^1}$ is an operating resistance of the diode $D_1$. Similarly, a feedback amplification $A_{62}$ of the attenuating circuit 3 to the base of the transistor $Q_3$ is represented by $$A_{62} = r_{D^2}/(R_3 + r_{D^2}) \cdot A_{TOT}{}^3/3 \qquad (30)$$

where $R_{D^2}$ is an operating resistance of the diode $D_2$. If the resistance of the resistor $R_1$ is the same as that of the resistor $R_2$ and the junction area of the diode $D_1$ is the same as that of the diode $D_2$, then $$A_{61} = A_{62} = A_6/2 \qquad (31)$$

If $A_{TOT}{}^3 = 30$ and $A_{5_F} = 0.5$, then, from the formulae (22) and (26), $$A_6 = 3.0 \qquad (32)$$

$$A_7 = 70 \ (A_8 = 1) \qquad (33)$$

Also, if a current of the current source $I_2$ is 1 mA, then $$r_{D^1} = r_{D^2} = 26 \ mV/(1 \ mA/2) = 52.0 \Omega \qquad (34)$$

Therefore, from the formulae (29), (31) to (34), $$1.5 = \{52/(R_4 + 52)\} \cdot 30/2$$

$$\therefore R_4 = 468\Omega$$

Figure 5:
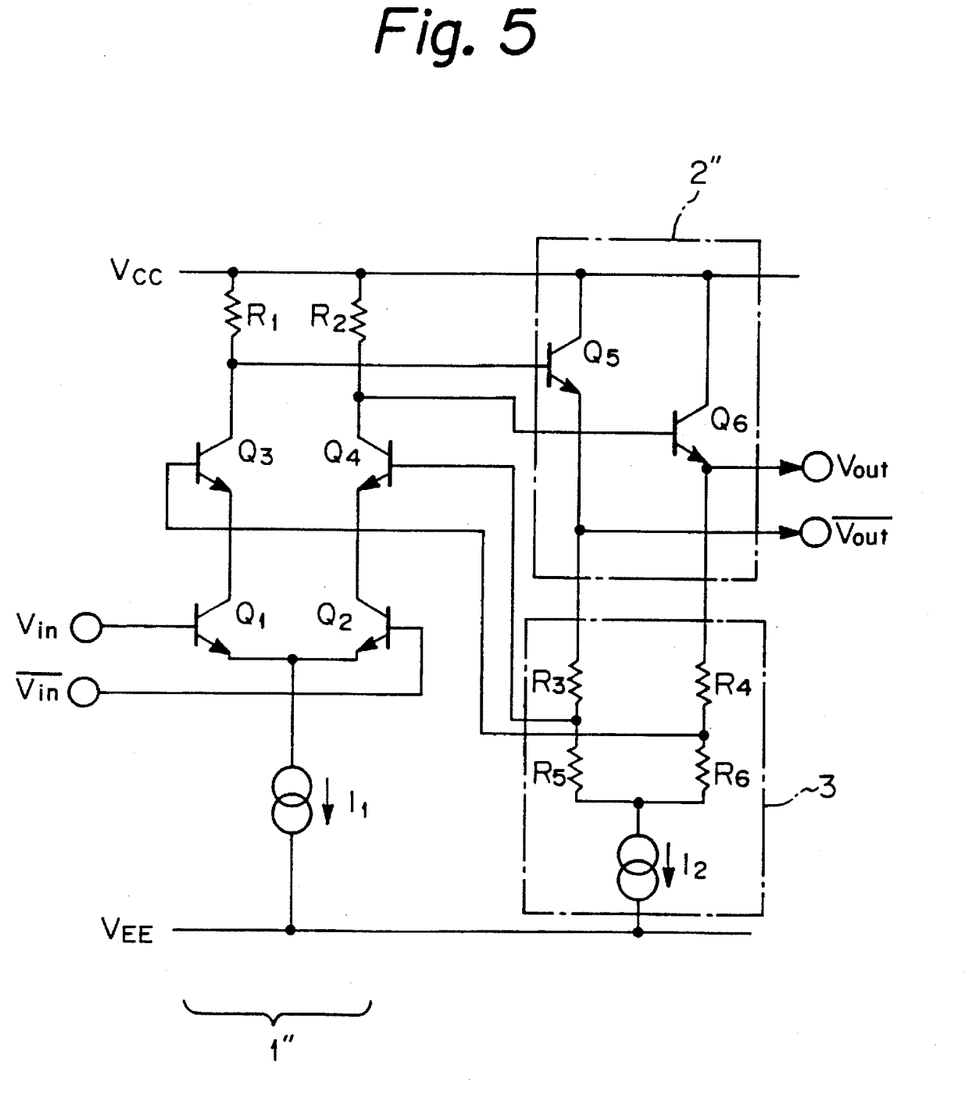
FIG. 5 is a detailed circuit diagram of the differential amplifier of FIG. 3 having a second example of the attenuating circuit.

A second example of the attenuating circuit 3 of FIG. 3 is illustrated in FIG. 5. In FIG. 5, resistors $R_5$ and $R_6$ are provided instead of the diodes $D_1$ and $D_2$, respectively, of FIG. 4. In this case, if the values of the resistors $R_5$ and $R_6$ are the same as the operating resistances of the diodes $D_1$ and $D_2$, respectively, i.e., $R_5 = R_6 = 52.0\Omega$, the attenuating circuit 3 of FIG. 5 operates in the same way as the attenuating circuit 3 of FIG. 4.

Figure 6:
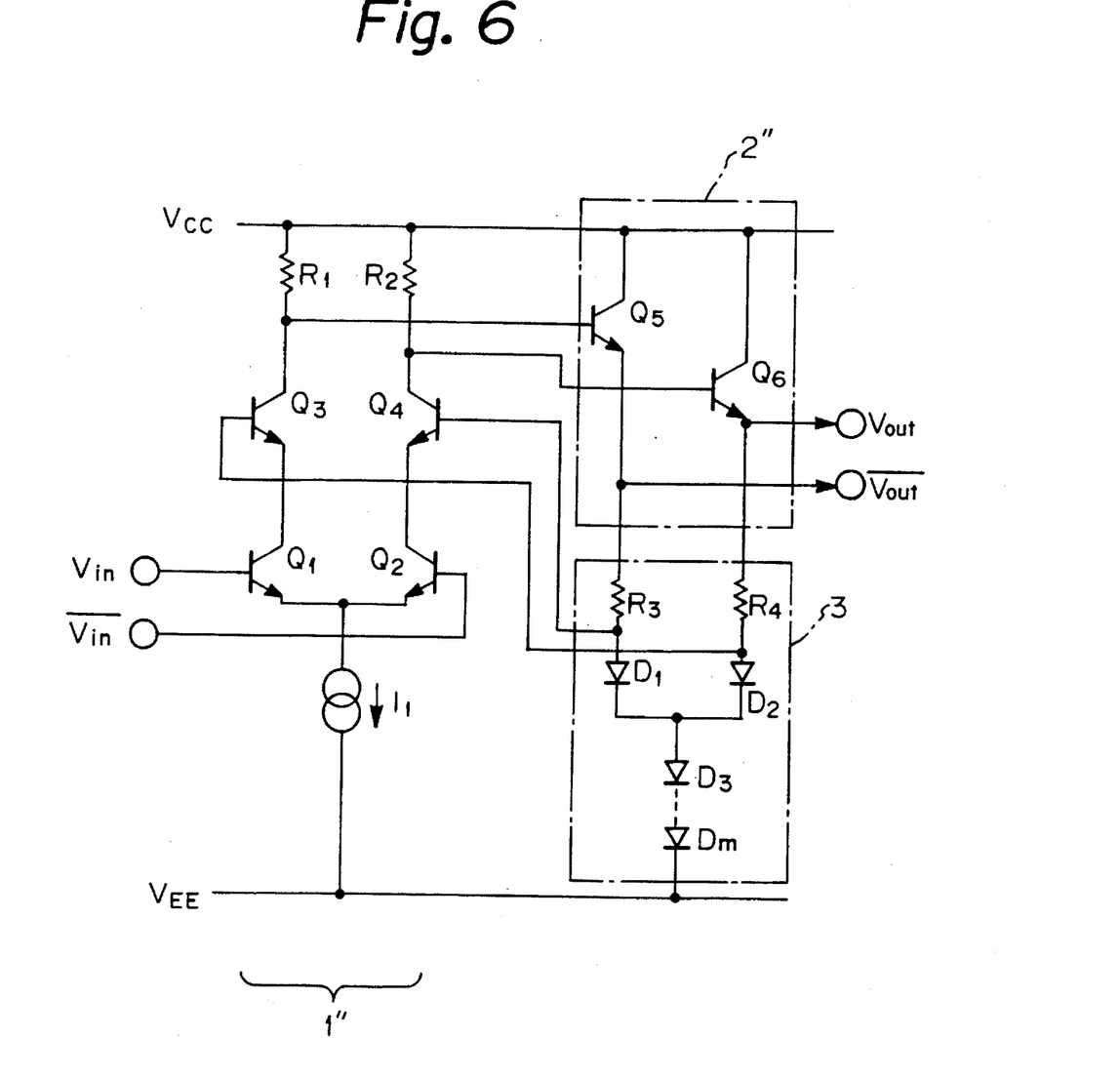
FIG. 6 is a detailed circuit diagram of the differential amplifier of FIG. 3 having a third example of the attenuating circuit.

A third example of the attenuating circuit 3 of FIG. 3 is illustrated in FIG. 6. In FIG. 6, diodes $D_3, \cdots, D_m$ are provided instead of the current source $I_2$ of FIG. 4. In this case, the attenuating circuit 3 of FIG. 6 can operate in the same way as the attenuating circuit 3 of FIG. 4.

Figure 7:
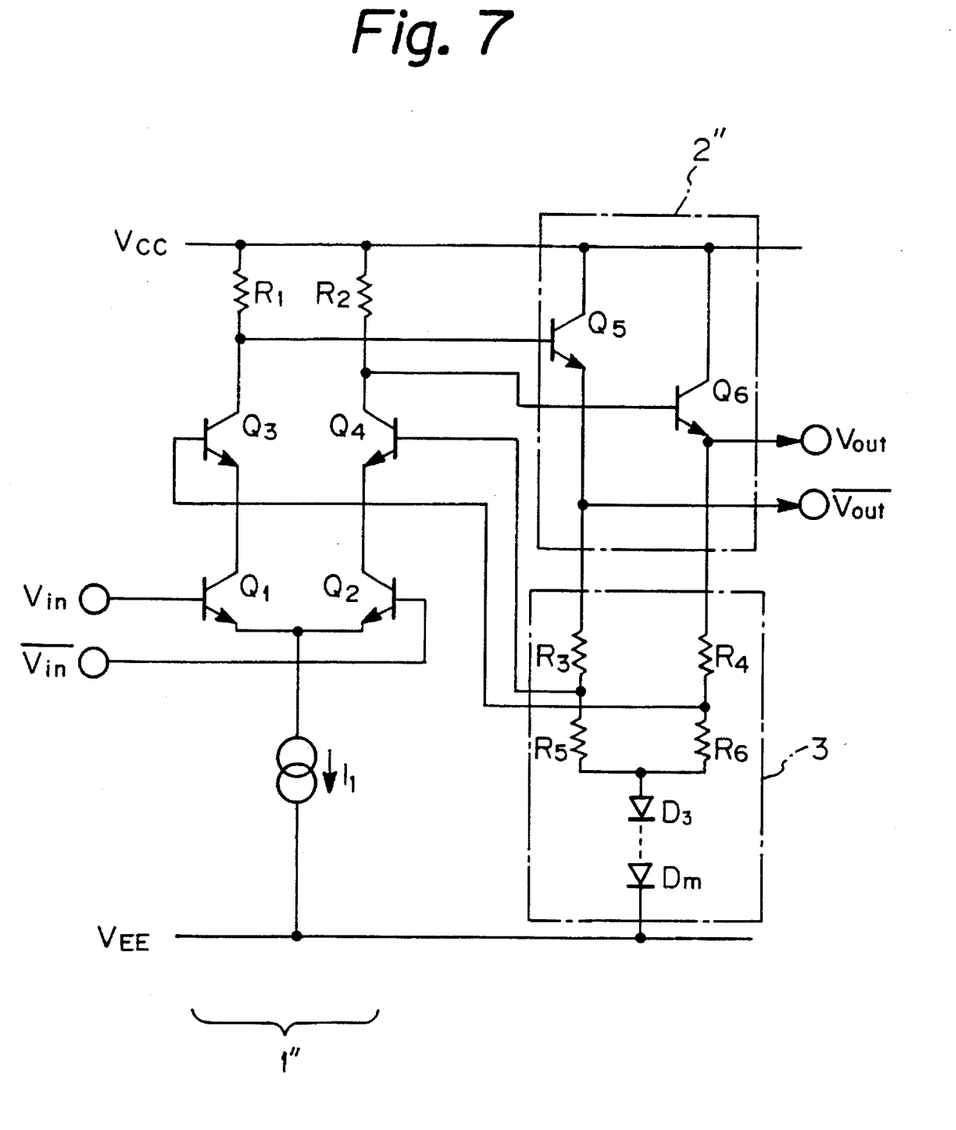
FIG. 7 is a detailed circuit diagram of the differential amplifier of FIG. 3 having a fourth example of the attenuating circuit.

A fourth example of the attenuating circuit 3 of FIG. 3 is illustrated in FIG. 7. In FIG. 7, diodes $D_3, \cdots, D_m$ are provided instead of the current source $I_2$ of FIG. 5. In this case, the attenuating circuit 3 of FIG. 7 can operate in the same way as the attenuating circuit 3 of FIG. 5.

Figure 8:
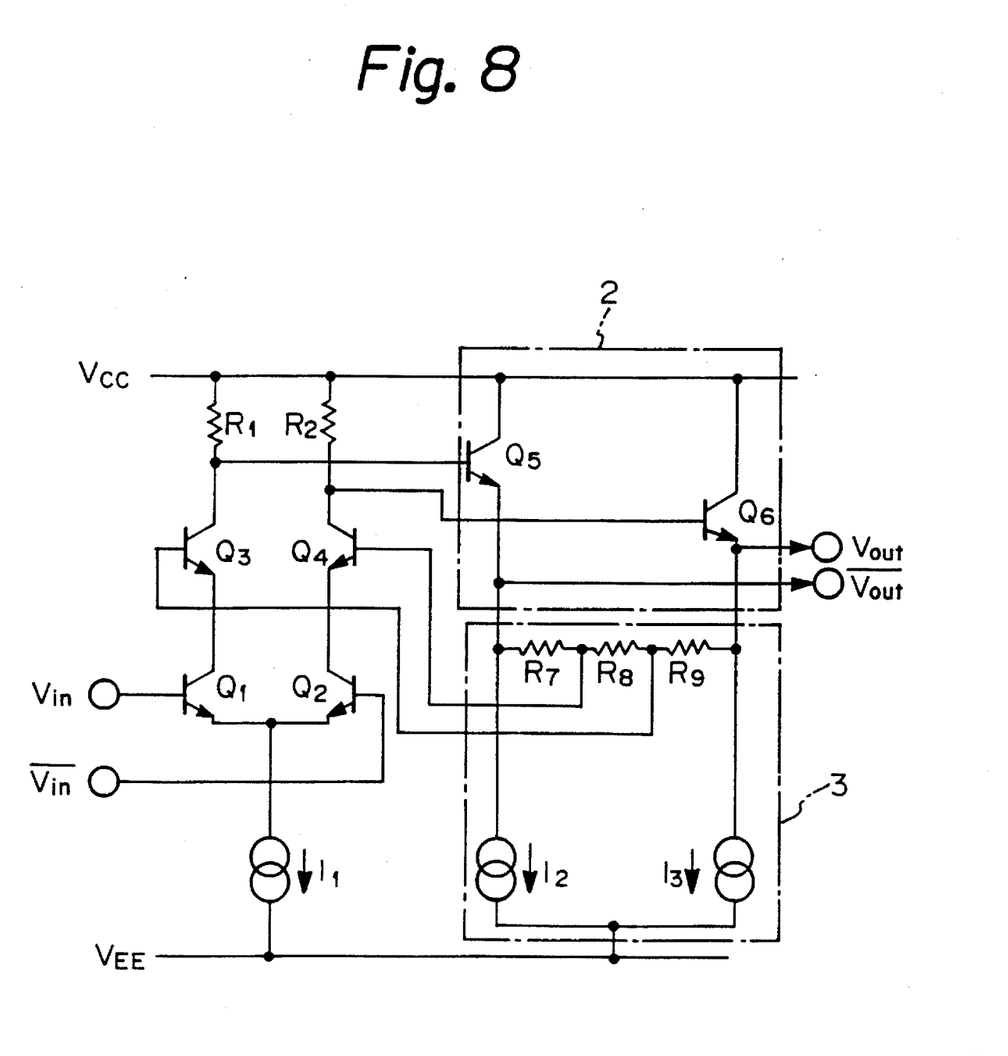
FIG. 8 is a detailed circuit diagram of the differential amplifier of FIG. 3 having a fifth example of the attenuating circuit.

A fifth example of the attenuating circuit 3 of FIG. 3 is illustrated in FIG. 8. That is, the attenuating circuit 3 includes a current source $I_2$ between the emitter follower $Q_5$ and the power supply terminal $V_{EE}$ and a current source $I_3$ between the emitter follower $Q_6$ and the power supply terminal $V_{EE}$. Also, the attenuating circuit 3 includes three resistors $R_7$, $R_8$ and $R_9$ in series between the emitter of the emitter follower $Q_5$ and the emitter of the emitter follower $Q_6$. A voltage at a node between the resistor $R_7$ and the resistor $R_8$ is fed back to the base of the transistor $Q_4$ of the input stage 1". Similarly, a voltage at a node between the resistor $R_8$ and the resistor $R_9$ is fed back to the base of the transistor $Q_3$ of the input stage 1".

A feedback amplification $A_{61}'$ of the attenuating circuit 3 to the base of the transistor $Q_4$ is represented by $$A_{61}' = \{R_7/(R_7 + R_8 + R_9)\} \cdot A_{TOT}{}^3 \qquad (35)$$

Similarly, a feedback amplification $A_{62}'$ of the attenuating circuit 3 to the base of the transistor $Q_3$ is represented by $$A_{62}' = \{R_9/(R_7 + R_8 + R_9)\} \cdot A_{TOT}{}^3 \qquad (36)$$

If the value of the resistor $A_7$ is the same as that of the resistor $R_9$, for example, if $R_7 = R_9 = 200\Omega$, then $$A_{61}' = A_{62}' = A_6/2 \qquad (37)$$

$A_{TOT}{}^3 = 30$ and $A_6 = 3.0$, then, from the formulae (35) (or (36)) and (37), $$1.5 = \{200/(200 + R_8 200)\} \cdot 30$$

$$\therefore R_8 = 3.6 \ k\Omega$$

As explained hereinbefore, according to the present invention, a differential input capacity can be reduced, and simultaneously, a noise level in output signals can be reduced without reducing the entire differential amplification.

We claim:

1. A differential amplifier comprising:

first and second power supply terminals;

an input stage, connected between said first and second power supply terminals, for receiving first and second input signals and outputting first and second intermediate signals in response to said first and second input signals;

an output stage, connected to said first power supply terminal and to said input stage, for receiving said first and second intermediate signals and outputting first and second output signals in response to said first and second intermediate signals; and an attenuating circuit, connected between said output stage and said second power supply terminal and to said input stage, for attenuating said first and second output signals to generate first and second attenuation signals in response to said first and second output signals and transmitting said first and second attenuation signals to said input stage, wherein said input stage includes a first current source connected to said second power supply terminal, first and second transistors having bases for receiving said first and second input signals, respectively, and emitters connected to said first current source, a third transistor having an emitter connected to a collector of said first transistor and a base for receiving said second attenuation signal, a fourth transistor having an emitter connected to a collector of said second transistor and a base for receiving said first attenuation signal, a first resistor connected between said first power supply terminal and a collector of said third transistor, and a second resistor connected between said first power supply terminal and a collector of said fourth transistor, wherein said output stage includes a first emitter follower for receiving said first intermediate signal to generate said first output signal, and a second emitter follower for receiving said second intermediate signal to generate said second output signal.

2. A differential amplifier as set forth in claim 1, wherein said attenuating circuit includes a third resistor connected to an output of said first emitter follower, a fourth resistor connected to an output of said second emitter follower, a second current source connected to said second power supply terminal, a first diode connected between said third resistor and said second current source, and a second diode connected between said fourth resistor and said second current source, a first node between said third resistor and said first diode generating said first attenuation signal, a second node between said fourth resistor and said second diode generating said second attenuation signal.

3. A differential amplifier as set forth in claim 1, wherein said attenuating circuit includes a third resistor connected to an output of said first emitter follower, a fourth resistor connected to an output of said second emitter follower, a second current source connected to said second power emitter follower, a second current source connected to said second power supply terminal, a fifth resistor connected between said third resistor and said second current source, and a sixth resistor connected between said fourth resistor and said second current source, a first node between said third resistor and said fifth resistor generating said first attenuation signal, a second node between said fourth resistor and said sixth resistor generating said second attenuation signal.

4. A differential amplifier as set forth in claim 1, wherein said attenuating circuit includes a third resistor connected to an output of said first emitter follower, a fourth resistor connected to an output of said second emitter follower, diode means connected to said second power supply terminal, a first diode connected between said third resistor and said diode means, and a second diode connected between said fourth resistor and said diode means, a first node between said third resistor and said first diode generating said first attenuation signal, a second node between said fourth resistor and said second diode generating said second attenuation signal.

5. A differential amplifier as set forth in claim 1, wherein said attenuating circuit includes a third resistor connected to an output of said first emitter follower, a fourth resistor connected to an output of said second emitter follower, diode means connected to said second power supply terminal, a fifth resistor connected between said third resistor and said diode means, and a sixth resistor connected between said fourth resistor and said diode means, a first node between said third resistor and said fifth resistor generating said first attenuation signal, a second node between said fourth resistor and said sixth resistor generating said second attenuation signal.

6. A differential amplifier as set forth in claim 1, wherein said attenuating circuit includes a second current source connected between an output of said first emitter follower and said second power supply terminal, and a third current source connected between an output of said second emitter follower and said second power supply terminal, third, fourth and fifth resistors connected between the output of said first emitter follower and the output of said second emitter follower, a first node between said third resistor and said fourth resistor generating said first attenuation signal, a second node between said fourth resistor and said fifth resistor generating said second attenuation signal.

7. A differential amplifier comprising:

first and second power supply terminals;

a current switch having a first current source connected to said second power supply terminal and first and second transistors connected commonly to said first current source, said first and second transistors being controlled by first and second input signals, respectively, a first load amplifier connected between said first power supply terminal and said first transistor and having an amplification larger than 1;

a second load amplifier connected between said first power supply terminal and said second transistor and having an amplification larger than 1;

a first emitter follower connected to said first power supply terminal and to said first load amplifier, said first emitter follower having an amplification of approximately 1 and generating a first output signal;

a second emitter follower connected to said first power supply terminal and to said second load amplifier, said second emitter follower having an amplification of approximately 1 and generating a second output signal; and a feedback circuit, connected to said first and second emitter followers and said second power supply terminal, for attenuating said first and second output signals to generate first and second attenuation signals, said first and second attenuation signals being transmitted to said second and first load amplifiers, respectively, thus substantially reducing an amplification of said first and second transistors to less than 1, wherein said feedback circuit includes a first resistor connected to an output of said first emitter follower, a second resistor connected to an output of said second emitter follower, a second current source connected to said second power supply terminal, a first diode connected between said first resistor and said second current source, and a second diode connected between said second resistor and said second current source, a first node between said first resistor and said first diode generating said first attenuation signal, a second node between said second resistor and said second diode generating said second attenuation signal.

8. A differential amplifier comprising:

first and second power supply terminals;

a current switch having a first current source connected to said second power supply terminal and first and second transistors connected commonly to said first current source, said first and second transistors being controlled by first and second input signals, respectively, a first load amplifier connected between said first power supply terminal and said first transistor and having an amplification larger than 1;

a second load amplifier connected between said first power supply terminal and said second transistor and having an amplification larger than 1;

a first emitter follower connected to said first power supply terminal and to said first load amplifier, said first emitter follower having an amplification of approximately 1 and generating a first output signal;

a second emitter follower connected to said first power supply terminal and to said second load amplifier, said second emitter follower having an amplification of approximately 1 and generating a second output signal; and a feedback circuit, connected to said first and second emitter followers and said second power supply terminal, for attenuating said first and second output signals to generate first and second attenuation signals, said first and second attenuation signals being transmitted to said second and first load amplifiers, respectively, thus substantially reducing an amplification of said first and second transistors to less than 1, wherein said feedback circuit includes a first resistor connected to an output of said first emitter follower, a second resistor connected to an output of said second emitter follower, diode means connected to said second power supply terminal, a first diode connected between said first resistor and said diode means, and a second diode connected between said second resistor and said diode means, a first node between said first resistor and said first diode generating said first attenuation signal, a second node between said second resistor and said second diode generating said second attenuation signal.

9. A differential amplifier comprising:

first and second power supply terminals;

a current switch having a first current source connected to said second power supply terminal and first and second transistors connected commonly to said first current source, said first and second transistors being controlled by first and second input signals, respectively, a first load amplifier connected between said first power supply terminal and said first transistor and having an amplification larger than 1;

a second load amplifier connected between said first power supply terminal and said second transistor and having an amplification larger than 1;

a first emitter follower connected to said first power supply terminal and to said first load amplifier, said first emitter follower having an amplification of approximately 1 and generating a first output signal;

a second emitter follower connected to said first power supply terminal and to said second load amplifier, said second emitter follower having an amplification of approximately 1 and generating a second output signal; and a feedback circuit, connected to said first and second emitter followers and said second power supply terminal, for attenuating said first and second output signals to generate first and second attenuation signals, said first and second attenuation signals being transmitted to said second and first load amplifiers, respectively, thus substantially reducing an amplification of said first and second transistors to less than 1;

wherein said feedback circuit includes a first resistor connected to an output of said first emitter follower, a second resistor connected to an output of said second emitter follower, a second current source connected to said second power supply terminal, a third resistor connected between said first resistor and said second current source, and a fourth resistor connected between said second resistor and said second current source, a first node between said first resistor and said third resistor generating said first attenuation signal, a second node between said second resistor and said fourth resistor generating said second attenuation signal.

10. A differential amplifier comprising:

first and second power supply terminals;

a current switch having a first current source connected to said second power supply terminal and first and second transistors connected commonly to said first current source, said first and second transistors being controlled by first and second input signals, respectively, a first load amplifier connected between said first power supply terminal and said first transistor and having an amplification larger than 1;

a second load amplifier connected between said first power supply terminal and said second transistor and having an amplification larger than 1;

a first emitter follower connected to said first power supply terminal and to said first load amplifier, said first emitter follower having an amplification of approximately 1 and generating a first output signal;

a second emitter follower connected to said first power supply terminal and to said second load amplifier, said second emitter follower having an amplification of approximately 1 and generating a second output signal; and a feedback circuit, connected to said first and second emitter followers and said second power supply terminal, for attenuating said first and second output signals to generate first and second attenuation signals, said first and second attenuation signals being transmitted to said second and first load amplifiers, respectively, thus substantially reducing an amplification of said first and second transistors to less than 1, wherein said feedback circuit includes a first resistor connected to an output of said first emitter follower, a second resistor connected to an output of said second emitter follower, diode means connected to said second power supply terminal, a third resistor connected between said first resistor and said diode means, and a fourth resistor connected between said second resistor and said diode means, a first node between said first resistor and said third resistor generating said first attenuation signal, a second node between said second resistor and said fourth resistor generating said second attenuation signal.

11. A differential amplifier comprising:

first and second power supply terminals;

a current switch having a first current source connected to said second power supply terminal and first and second transistors connected commonly to said first current source, said first and second transistors being controlled by first and second input signals, respectively, a first load amplifier connected between said first power supply terminal and said first transistor and having an amplification larger than 1;

a second load amplifier connected between said first power supply terminal and said second transistor and having an amplification larger than 1;

a first emitter follower connected to said first power supply terminal and to said first load amplifier, said first emitter follower having an amplification of approximately 1 and generating a first output signal;

a second emitter follower connected to said first power supply terminal and to said second load amplifier, said second emitter follower having an amplification of approximately 1 and generating a second output signal; and a feedback circuit, connected to said first and second emitter followers and said second power supply terminal, for attenuating said first and second output signals to generate first and second attenuation signals, said first and second attenuation signals being transmitted to said second and first load amplifiers, respectively, thus substantially reducing an amplification of said first and second transistors to less than 1, wherein said feedback circuit includes a second current source connected between an output of said first emitter follower and said second power supply terminal, and a third current source connected between an output of said second emitter follower and said second power supply terminal, and a third current source connected between an output of said second emitter follower and said second power supply terminal, first, second and third resistors connected between the output of said first emitter follower and the output of said second emitter follower, a first node between said first resistor and said second resistor generating said first attenuation signal, a second node between said second resistor and said third resistor generating said second attenuation signal.

* * * * *